United States Patent
Wang

(10) Patent No.: US 8,169,086 B2
(45) Date of Patent: May 1, 2012

(54) SEMICONDUCTOR CHIP PAD STRUCTURE AND METHOD FOR MANUFACTURING THE SAME

(75) Inventor: Hui-Heng Wang, Taoyuan County (TW)

(73) Assignee: Arima Optoelectronics Corp., Taoyuan County (TW)

( * ) Notice: Subject to any disclaimer, the term of this patent is extended or adjusted under 35 U.S.C. 154(b) by 211 days.

(21) Appl. No.: 12/749,711

(22) Filed: Mar. 30, 2010

(65) Prior Publication Data

US 2010/0264453 A1 Oct. 21, 2010

(30) Foreign Application Priority Data

Apr. 17, 2009 (TW) ............................... 98112748 A

(51) Int. Cl.
*H01L 23/48* (2006.01)
*H01L 23/52* (2006.01)
(52) U.S. Cl. .. 257/784; 257/773; 257/786; 257/E23.024
(58) Field of Classification Search .................. 257/784, 257/773, 786, 436, E23.024
See application file for complete search history.

(56) References Cited

U.S. PATENT DOCUMENTS

| | | | | |
|---|---|---|---|---|
| 5,373,111 | A * | 12/1994 | McClure et al. | 174/250 |
| 6,215,670 | B1 * | 4/2001 | Khandros | 361/774 |
| 6,444,295 | B1 * | 9/2002 | Peng et al. | 428/209 |
| 6,528,879 | B2 * | 3/2003 | Sakamoto et al. | 257/729 |
| 6,599,578 | B2 * | 7/2003 | Peng et al. | 427/402 |
| 7,667,224 | B2 * | 2/2010 | Ohashi et al. | 257/13 |
| 2002/0004516 | A1 * | 1/2002 | Stutzmann et al. | 514/367 |
| 2005/0073057 | A1 * | 4/2005 | Tiziani et al. | 257/784 |
| 2006/0082000 | A1 * | 4/2006 | Li et al. | 257/784 |
| 2007/0145883 | A1 * | 6/2007 | Ohashi et al. | 313/498 |
| 2008/0185737 | A1 * | 8/2008 | Marimuthu | 257/780 |

* cited by examiner

*Primary Examiner* — Nitin Parekh
(74) *Attorney, Agent, or Firm* — Rosenberg, Klein & Lee

(57) ABSTRACT

A semiconductor chip pad structure and a method for manufacturing the same, wherein a flat area at the center of the terminal pad and a roughened area at the periphery thereof are provided by use of the mask photolithograph technique and the roughening process. The central area provides a sufficient adhering force for the ball bond while the peripheral area prevents the wire-bonding vibrating energy from the lateral transmission to the external side of the terminal pad. In this way, the ball bond for the terminal pad may meet the wire-bonding requirements. Moreover, the ball bond quality is ensured.

4 Claims, 2 Drawing Sheets

US 8,169,086 B2

SEMICONDUCTOR CHIP PAD STRUCTURE AND METHOD FOR MANUFACTURING THE SAME

BACKGROUND OF THE INVENTION

1. Field of the Invention

The invention relates to a semiconductor chip pad structure and a method for manufacturing the same, and more particularly to an arrangement with a flat area at the center of the terminal pad and a roughened area at the periphery thereof.

2. Description of the Related Art

Light-emitting diodes (LED) have a small size and a high luminous efficiency. Moreover, they are able to emit a light having different colors, thereby ensuring a various application. As a result, a lot of packaging (assembly) shapes have been created. The packaged products are generally known as lamps or SMD (surface mounting device). Apart from the appearance, another important consideration point is the quality reliability. Therefore, the wire bonding is an important step for both the lamp arrangement and the SMD-arrangement before or after the packaging process. The wire bonding is done for fitting a metal pad to the positive side of the LED chip. By application of energies such as heat, pressure and ultrasonic wave, the metal material is fitted to the surface of the pad for establishing an electric connection. In this way, the electric current tends to be delivered via the metal wire to the external lead frame. As shown in FIG. 1, one end of a metal wire 10 is connected to a terminal pad 21 of a semiconductor chip 20 by a ball bond while the other end thereof is secured to a lead frame 30 by a wedge bond.

Normally, a wire bonder is required for the ball bond. The core of the wire bonder is the bonding head (used for applying pressure). The heat energy is supplied by the mini-heater (that clamps the lead frame). However, both the pressure and the heat are provided via the bonding head. Thus, it plays an important part in the bonding quality. Any mechanic devices have their own mechanic difference and fluctuation that tend to cause an undesired wire-bonding shift for the ball bond. That is, the center of the ball bond is misaligned with the center of the pad. Accordingly, the pressure and the ultrasonic energy will be abnormally and asymmetrically delivered to the area of the light-emitting layer adjacent to the pad. In this way, it is likely to do direct harm to the light-emitting layer when the light-emitting layer (made of AlInGaP) of LED is not hard enough or when it is roughened by a special treatment. Damages like cracks or the cratering may take place and cause an adverse effect on the yield rate of the LED packaging elements as well as on the electric reliability.

SUMMARY OF THE INVENTION

An object of the invention is to provide a semiconductor chip pad structure and a method for manufacturing the same that ensures the quality of the ball bond.

In order to achieve the above-mentioned object, the invention includes a flat area at the center thereof and a roughened area at the periphery thereof. The flat area at the center thereof provides a sufficient adhering force for the ball bond while the roughened area at the periphery thereof prevents the wire-bonding vibrating energy from the lateral transmission to the external side of the terminal pad. In this way, the ball bond secured to the terminal pad may meet the wire-bonding requirements.

The proportion of the central flat area to the total surface area of the terminal pad is 50 to 90%. The proportion at 70% is most acceptable. The semiconductor chip is constructed as LED (light-emitting diode).

According to the invention, a method for manufacturing the semiconductor chip pad structure includes the following steps:

Defining the central area of the terminal pad on the surface layer (such as LED light-emitting layer) of the semiconductor chip by use of the mask photolithograph technique;

Roughening the surface layer of the semiconductor chip outside the mask; and

Evaporating the metal material of the terminal pad onto the flat and roughened areas of the surface layer of the semiconductor chip.

In this way, the terminal pad (with a flat area at the center thereof and a roughened area at the periphery thereof) is created on the surface layer of the semiconductor chip.

According to the invention, another method for manufacturing the semiconductor chip pad structure includes the following steps:

Evaporating the metal material of the terminal pad onto the surface layer of the semiconductor chip;

Defining the peripheral area outside the terminal pad by use of the mask photolithograph technique; and Roughening the terminal pad surface at the peripheral area by use of the physical impact or the chemical etching.

In this way, the terminal pad (with a flat area at the center thereof and a roughened area at the periphery thereof) is created on the surface layer of the semiconductor chip.

The surface layer of the semiconductor chip is constructed as LED light-emitting layer.

BRIEF DESCRIPTION OF THE DRAWINGS

The accomplishment of this and other objects of the invention will become apparent from the following descriptions and its accompanying figures of which.

DETAILED DESCRIPTION OF THE PREFERRED EMBODIMENT

Figure 1:
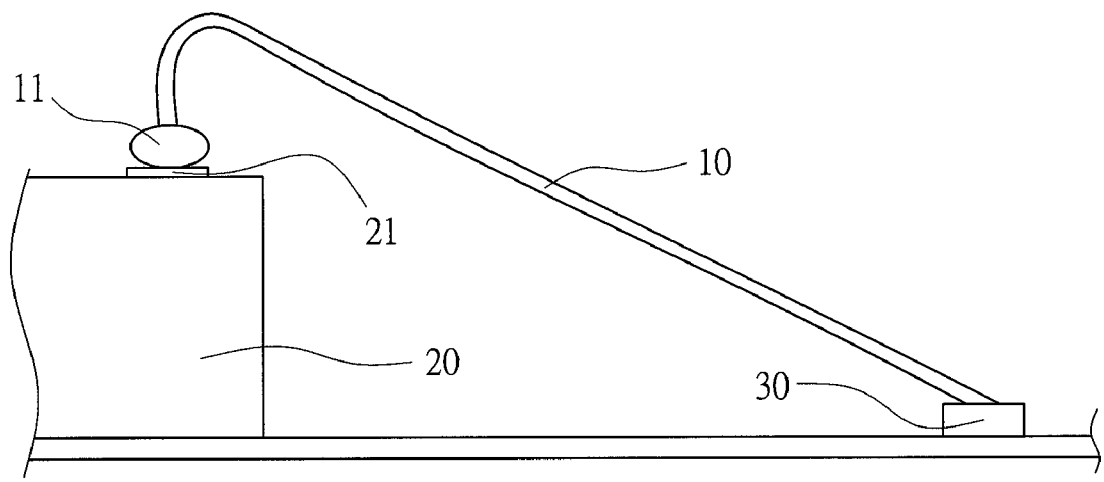
FIG. 1 is a schematic drawing of a wire-bonding structure of the semiconductor chip.
Figure 2:
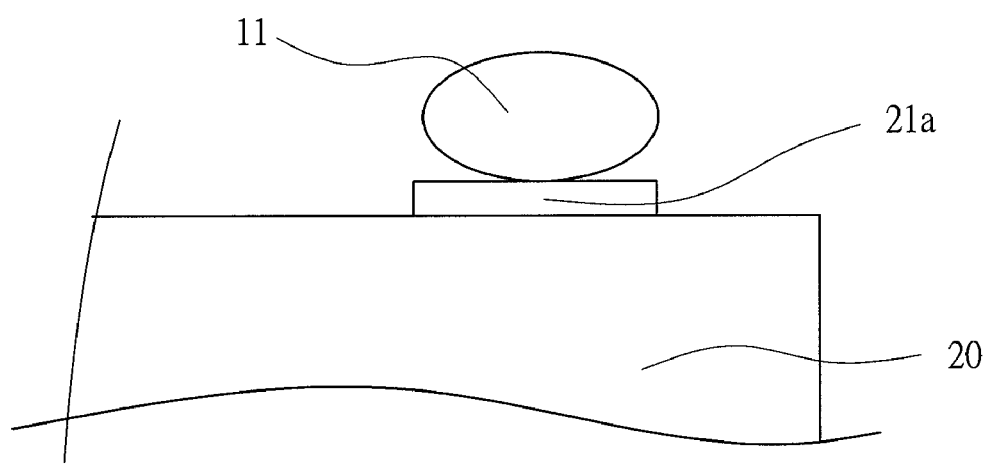
FIG. 2 is a schematic drawing of the ball bond attached to a flat terminal pad.
Figure 3:
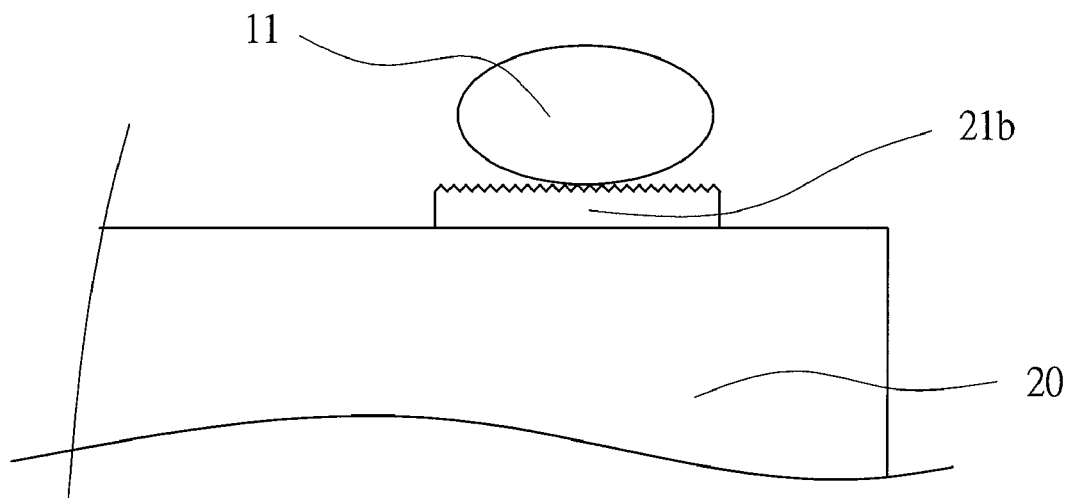
FIG. 3 is a schematic drawing of the ball bond attached to a roughened terminal pad.

First of all, referring to FIG. 2, the surface of the terminal pad 21a of a conventional semiconductor chip 20 is designed to be a flat surface. As shown in FIG. 3, a terminal pad 21b having a roughened surface is positioned on the same surface layer (such as LED light-emitting layer) of the semiconductor chip 20. The results of the wire-bonding process applied to the ball bond 11 of the two above-mentioned arrangements indicate that the terminal pad 21b having the roughened surface may resist more against the ultrasonic vibration than the terminal pad 21a having the flat surface. The reason lies in that the transverse transmission of energy tends to be hindered by the roughened surface. In other words, it is difficult to transmit the vibrating energy of the ultrasonic wave from both sides of the terminal pad 21b having the roughened surface to the bottom. Therefore, it is more unlikely to cause crack or cratering of the chip (with the terminal pad 21b having the roughened surface) during the wire-bonding process according to the arrangement in FIG. 3. The result for the terminal pad 21a having the flat surface is just opposite thereto.

However, it is not a perfect arrangement when the entire surface of the pad is roughened. The reason lies in that the roughened surface tends to cause an insufficient adhesion force. Actually, it is caused either by the fact that the partial gas will be confined to the area adjacent to the center of the pad at the moment when the ball bond 11 is in contact with the roughened pad or by the fact that the foreign matter is easily adhered there (and therefore uneasily washed away).

Figure 4:
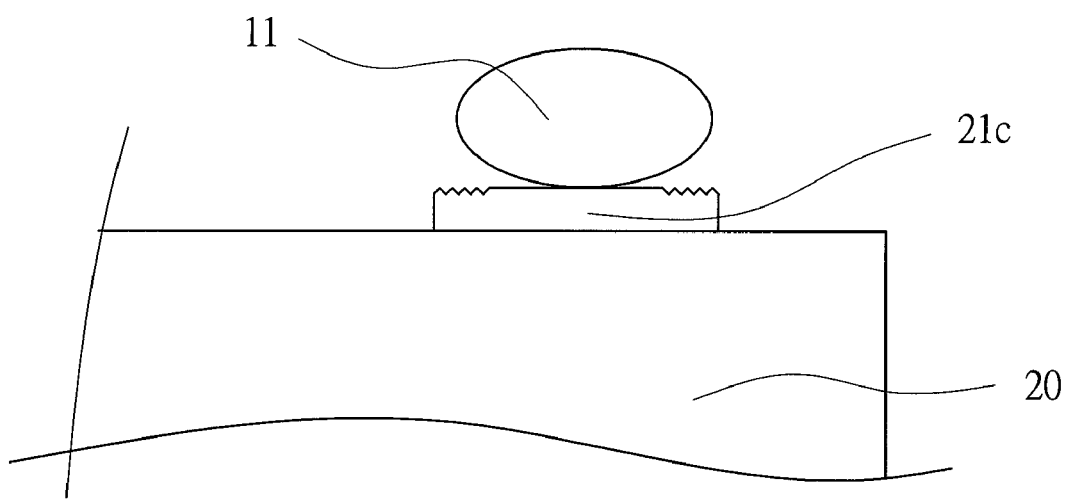
FIG. 4 is a schematic drawing of the structure of the invention.

Based on the above-mentioned observation and the wire-bonding technical standard, the invention discloses a terminal pad 21c being flat at the central area and being rough at the peripheral area (see FIG. 4). The flat surface at the central area of the pad provides a sufficient adhering force to ensure a reliable attachment between the ball bond 11 and the terminal pad 21c. Meanwhile, the roughened surface at the peripheral area prevents the ultrasonic vibrating energy from the lateral transmission to the external side of the terminal pad 21c. The proportion of the central flat area to the total surface area of the terminal pad should meet the wire-bonding technical standard (or requirements, such as the thrust). Normally, the proportion is 50 to 90%. The proportion at 70% is most acceptable in consideration of the welding process.

According to the invention, a method for manufacturing the semiconductor chip pad structure includes the following steps:

Defining the central area of the terminal pad on the surface layer (such as LED light-emitting layer) of the semiconductor chip by use of the mask photolithograph technique;

Roughening the surface layer of the semiconductor chip outside the mask; and

Evaporating the metal material of the terminal pad onto the flat and roughened areas of the surface layer of the semiconductor chip.

In this way, the terminal pad (with a flat area at the center thereof and a roughened area at the periphery thereof) is created on the surface layer of the semiconductor chip.

According to the invention, another method for manufacturing the semiconductor chip pad structure includes the following steps:

Evaporating the metal material of the terminal pad onto the surface layer of the semiconductor chip;

Defining the peripheral area outside the terminal pad by use of the mask photolithograph technique; and Roughening the terminal pad surface at the peripheral area by use of the physical impact or the chemical etching.

In this way, the terminal pad (with a flat area at the center thereof and a roughened area at the periphery thereof) is created on the surface layer of the semiconductor chip.

Based on the above-mentioned disclosure, a terminal pad (with a flat area at the center thereof and a roughened area at the periphery thereof) can be produced by use of the mask photolithograph technique and the roughening process. The central area provides a sufficient adhering force for the ball bond while the peripheral area prevents the wire-bonding vibrating energy from the lateral transmission to the external side of the terminal pad. In this way, the ball bond for the terminal pad may meet the wire-bonding requirements. Moreover, the ball bond quality is ensured.

What is claimed is:

1. A semiconductor chip pad structure, comprising a terminal pad having top surface with a flat area at the center thereof and a roughened area at the periphery thereof, wherein the flat area at the center thereof provides a sufficient adhering force for a ball bond formed directly in contact with and only on the flat area while the roughened area at the periphery thereof prevents the wire-bonding vibrating energy from the lateral transmission to an external side of the terminal pad, thereby meeting the wire-bonding requirements.

2. The semiconductor chip pad structure as recited in claim 1 wherein the proportion of the flat area at the center of the top surface to the total surface area of the top surface is 50 to 90%.

3. The semiconductor chip pad structure as recited in claim 2 wherein the proportion of the flat area at the center of the top surface to the total surface area of the top surface is 70%.

4. The semiconductor chip pad structure as recited in claim 3 wherein the semiconductor chip is constructed as LED (light-emitting diode).

* * * * *